United States Patent
Wang et al.

(10) Patent No.: US 9,570,294 B2
(45) Date of Patent: Feb. 14, 2017

(54) PREPARATION METHOD OF GRAPHENE NANORIBBON ON H-BN

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Haomin Wang, Shanghai (CN); Li He, Shanghai (CN); Lingxiu Chen, Shanghai (CN); Hong Xie, Shanghai (CN); Huishan Wang, Shanghai (CN); Shujie Tang, Shanghai (CN); Lei Li, Shanghai (CN); Daoli Zhang, Shanghai (CN); Xiaoming Xie, Shanghai (CN); Mianheng Jiang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

(*) Notice: Subject to any disclaimer, the term of this patent is extended or adjusted under 35 U.S.C. 154(b) by 0 days.

(21) Appl. No.: 14/803,371

(22) Filed: Jul. 20, 2015

(65) Prior Publication Data
US 2016/0260604 A1 Sep. 8, 2016

(30) Foreign Application Priority Data
Mar. 5, 2015 (CN) .......................... 2015 1 0986759

(51) Int. Cl.
H01L 21/02 (2006.01)
H01L 21/311 (2006.01)

(52) U.S. Cl.
CPC ..... *H01L 21/02527* (2013.01); *H01L 21/0259* (2013.01); *H01L 21/02642* (2013.01); *H01L 21/31111* (2013.01)

(58) Field of Classification Search
None
See application file for complete search history.

(56) References Cited

U.S. PATENT DOCUMENTS

2011/0300058 A1* 12/2011 Strupinski .............. B82Y 30/00
423/448
2013/0078424 A1* 3/2013 Ding ................... C23C 16/0254
428/141
2013/0140526 A1* 6/2013 Kim ...................... C30B 25/165
257/29

* cited by examiner

*Primary Examiner* — Alexander Ghyka
(74) *Attorney, Agent, or Firm* — Global IP Services; Tianhua Gu

(57) ABSTRACT

A preparation method of a graphene nanoribbon on h-BN, comprising: 1) forming a h-BN groove template with a nano ribbon-shaped groove structure on the h-BN by adopting a metal catalysis etching method; 2) growing a graphene nanoribbon in the h-BN groove template by adopting a chemical vapor deposition method. In the present invention, a CVD method is adopted to directly prepare a morphology controllable graphene nanoribbon on the h-BN, which helps to solve the long-term critical problem that the graphene is difficult to nucleate and grow on an insulating substrate, and to avoid the series of problems introduced by the complicated processes of the transferring of the graphene and the subsequent clipping manufacturing for a nanoribbon and the like.

15 Claims, 3 Drawing Sheets

PREPARATION METHOD OF GRAPHENE NANORIBBON ON H-BN

CROSS REFERENCE TO RELATED PATENT APPLICATION

The present application claims the priority of CN 2015100986759 filed on Mar. 5, 2015.

BACKGROUND OF THE PRESENT INVENTION

Field of Invention

The present invention belongs to the field of low-dimensional materials and advanced materials, and particularly relates to a preparation method of a graphene nanoribbon on h-BN (hexagonal boron nitride (h-BN)).

Description of Related Arts

Graphene has become a popular research issue in science and industry due to its superior nature in physical-chemical properties, and is expected to be a significant building-block material in the new generation of micro-nano electronic devices due to its superior electronic transport characteristics and clipping manufacturing characteristics. However, the property of the current graphene is subject to the preparation method and means, and the application thereof is thus limited. At present, the commonly used method for preparing a graphene includes a mechanical stripping method, a chemical vapor deposition method (CVD), a SiC epitaxial growth method and a graphite oxidation-reduction method and the like, wherein, the CVD method has become the quickly developed and the most popular preparation method as a result of low cost, easy large-scale production and compatibility with semiconductor technology. However, the CVD method is catalytic growing a graphene on a transition metal, but fails to be directly applied in the preparation of electron devices, while it is required to transfer the graphene to a dielectric layer to achieve an effective assembled device. At present, $SiO_2$/Si is adopted in most dielectric layers of the studied graphene photoelectric devices. Researchers has pointed out that, due to the localized carrier doping of the graphene caused by charge impurities of the $SiO_2$ surface, and the scattering effect of the phonons in the $SiO_2$-graphene interface to the graphene carriers, an upper limit of the electronic mobility of the graphene is dropped to 40000 $cm^2$/Vs, which is far below the theoretical value of an intrinsic graphene, thereby decreasing the applications of the graphene. Besides, the transfer process of the graphene adopts a wet chemical method, which not only complicates the technological process, but also inevitably causes a damage and contamination to graphene lattice and thus reduces the quality of the graphene, thereby penalizing the preparation of high-performance electron devices. Therefore, it has become one of the key problems in graphene photoelectric device on how to avoid the transfer and to overcome the defect of $SiO_2$/Si substrate.

Moreover, the special crystal structure of the graphene leads to its distinctive zero-energy gap structure, while its metallic characteristic fails to be directly applied in the preparation of electron devices. Currently, though it is able to prepare graphene of relative few defects and complete structure, but the band gap of the obtained graphene is almost zero or quite small, which can hardly meet the requirements for semiconductor functional devices. Nevertheless, the application of the graphene is limited in the electronics field due to its zero-band gap structure. The theoretical and experimental research show that, energy gap of graphene nanoribbon possesses width dependent effect due to the quantum confinement effect and edge effect that graphene nanoribbon possesses. Results of the experimental research show definitely that the energy gap increases with the width decrease of the nanoribbon. Therefore, it is of great significance to develop the regulation of the electronic structure of the graphene and the confinement band gap technology. In terms of chemistry and physics, researchers have proposed a preparation method for modifying the graphene, an etching method or an external electric field regulation method directed at the geometric structure size and geometric structure of the graphene; or chemical methods, such as an edge modification method or a chemical doping method, all of which may open the band gap of the graphene to some extent. However, in those methods for regulating the electron structure of the graphene, it is required to prepare a graphene of complete structure, followed by performing modified regulation, which is subject to a restriction of process technology, and a non-control of doping concentration, etc. Also, from an electron device manufacture and a commercialization perspective, the process is tedious and is high in cost.

From the above, the development of the graphene faces the following challenges: its application in the field of nanoelectronic device and integrated circuits is limited by the electron structure of the zero-band gap of the graphene; the electrical property of the graphene material is far inferior to its intrinsic electrical property because of the introduction of defects and electric charge impurities in the existing preparation and transfer technology of graphene. Therefore, the present invention provides a preparation method of a graphene nanoribbon on h-BN, to overcome the bottlenecks in the current development of the graphene.

SUMMARY OF THE PRESENT INVENTION

In view of the foregoing disadvantages in the prior art, the object of the present invention is to provide a preparation method of a graphene nanoribbon on h-BN, to solve the various problems in the prior art.

In order to achieve the above object and other related objects, the present invention provides a preparation method of a graphene nanoribbon on h-BN, by which a h-BN groove template with a nano ribbon-shaped groove structure is obtained on h-BN by adopting a metal catalytic etching method, and subsequently a nucleation of a graphene in the nano ribbon-shaped groove structure is achieved to grow the graphene nanoribbon by controlling a CVD growth conditions. The h-BN is known as a "white" graphene, which is insulator, and has a same layered hexagon planar structure with the graphene. The h-BN features an atomically flat surface but without a dangling bond on (0001) plane. The lattice mismatch between the h-BN and the graphene is just about 1.8%, and the doping effect thereof is low, thereby enabling to maintain the intrinsic physical property of the graphene to the greatest extent, and making the h-BN become the most potential insulating substrate of a graphene device. While during the direct growth of a graphene nanoribbon on h-BN, by controlling the metal catalytic etching conditions and CVD reaction conditions, it enables to obtain the graphene nanoribbon with a controllable growth of morphology and structure, so as to achieve the object of improving its electrical properties.

The preparation method of a graphene nanoribbon on h-BN comprises steps of:

1) forming a h-BN groove template with a nano ribbon-shaped groove structure on the h-BN by adopting a metal catalysis etching method;

2) growing a graphene nanoribbon in the h-BN groove template by adopting a chemical vapor deposition method.

As a preferred solution of the preparation method of the graphene nanoribbon on h-BN, in step 1), the h-BN comprises one of an h-BN single crystal bulk, an h-BN thin film cleaved by a mechanical cleavage, and an h-BN thin film obtained by a chemical vapor deposition method.

Further, the h-BN is an h-BN thin film with a cleavage plane of atomic-level flatness by the mechanical cleavage method.

As a preferred solution of the preparation method of the graphene nanoribbon on h-BN, the metal catalysis etching method in step 1) comprises steps of:

1-1) forming a metal particle thin film with a catalysis etching effect on the h-BN;

1-2) performing anneal etching on the h-BN with the metal particle thin film, to obtain the h-BN groove template with the nano-ribbon-shaped groove structure.

Further, in step 1-1), a metal salt solution, which has a catalysis etching effect on the h-BN, such as $Zn(NO_3)_2$, $Cu(NO_3)_2$, $NiCl_2$, $FeCl_2$, $FeCl_3$, $CuSO_4$, $MgCl_2$, etc., is formed on the h-BN surface by a spin coating process.

Further, density and distribution of the etched nanoribbon-shaped groove structure is controlled by controlling a concentration of metal catalysis particle solution, where the concentration of metal catalysis particle is $5.29*10^{-3}$ mol/L~$5.29*10^{-1}$ mol/L.

Further, the anneal etching in step 1-2) is to perform an anneal-etching on the h-BN in a CVD tube furnace, with a carrier gas of Ar, and a working gas of $H_2$ or $O_2$ according to different etching orientation; wherein, it is available to obtain a nano ribbon-shaped groove structure with an Armchair boundary structure when the $H_2$ and Ar features a flow rate of 1:1~1:10, and it is available to obtain a nano ribbon-shaped groove structure with a zigzag edge structure when the $O_2$ and Ar features a flow rate of 1:1~0:10.

As a preferred solution of the preparation method of the graphene nanoribbon on h-BN, a temperature range of the anneal etching is 900° C.~1300° C., and a etching rate of the h-BN is controlled by controlling the temperature of the anneal etching.

As a preferred solution of the preparation method of the graphene nanoribbon on h-BN, a time range of the anneal etching is 10 min~300 min, and a depth, width and length of the nano ribbon-shaped groove structure is controlled by a time control of the anneal etching.

As a preferred solution of the preparation method of the graphene nanoribbon on h-BN, the nano ribbon-shaped groove structure features a depth of a thickness of 1~9 atomic layers, a width less than or equal to 1 µm, and a length larger than or equal to 100 nm.

As a preferred solution of the preparation method of the graphene nanoribbon on h-BN, the chemical vapor deposition method in step 2) comprises one of a low pressure chemical vapor deposition method LPCVD, a plasma enhanced chemical vapor deposition (PECVD), an ordinary pressure chemical vapor deposition (CVD) and a pulsed laser deposition (PLD).

As a preferred solution of the preparation method of the graphene nanoribbon on h-BN, a carbon source for growing the graphene nanoribbon in step 2) comprises a solid-state carbon source, a gaseous carbon source and a liquid-state carbon source, wherein, the solid-state carbon source comprises one of a graphite, a glucose and a polymethacrylate or a combination thereof, the liquid-state carbon source comprises a liquid benzene, the gaseous carbon source comprises one of a methane, an ethene and an acetylene or a combination thereof.

As a preferred solution of the preparation method of the graphene nanoribbon on h-BN, the carbon source for growing the graphene nanoribbon in step 2) is the acetylene and methane, wherein a gas flow ratio of the acetylene and the methane is 1:1~1:30.

Further, when growing the graphene nanoribbon, a step of adjusting a partial pressure ratio of the carbon source gas by introducing a silane is included to control a suitable growth rate, wherein, a gas volume range of the methane, silane and acetylene is 1:1:10~1:1:20.

As a preferred solution of the preparation method of the graphene nanoribbon on h-BN, an air pressure range for growing the graphene nanoribbon is 1 Pa~10 Pa, a temperature range therefore is 800° C.~1300° C., and a growth time range therefore is 1 min~1 Hour.

As a preferred solution of the preparation method of the graphene nanoribbon on h-BN, the obtained graphene nanoribbon in step 2) features a width less than or equal to 1 µm, a depth of a thickness of 1~9 atomic layers, and a length larger than or equal to 100 nm.

From the above, in the preparation method of a graphene nanoribbon on h-BN of the present invention, the nano ribbon-shaped groove structure is obtained as a template by metal catalysis etching the h-BN surface, the nucleation and growth of the graphene along the edge of the h-BN nanoribbon groove is achieved until filling the complete nanoribbon groove by controlling the CVD depositional conditions, to form the graphene nanoribbon. Nucleation energy for the nucleation of the graphene in the h-BN nanoribbon groove is less than the nucleation energy needed on the h-BN surface, whereas it is apt to nucleate at the defects of the substrate, especially at the edge of the h-BN nanoribbon groove. By controlling an appropriate CVD process conditions, such as air pressure, temperature, time and gas flow ratio, as well as taking advantage of the difference of the nucleation energy between the h-BN surface and the boundary of the h-BN nanoribbon groove, the nucleation of the graphene firstly appears at the boundary of the h-BN nanoribbon groove, then fills the h-BN groove in a growth mode of step flow to form the graphene nanoribbon. It is significant benefit to the subsequent morphological control of the graphene by adopting a metal catalysis etching process for etching h-BN to control the morphology of the h-BN nano ribbon groove template. Due to the epitaxial growth of the graphene, the formed marginal structure of the graphene is correspondence with the boundary structure of the h-BN, and, a number of layers, width, length and a density distribution of the graphene nanoribbon are influenced by the depth, width, length and density of the h-BN etching groove.

In the present invention, a CVD method is adopted to directly prepare a morphology controllable graphene nanoribbon on the h-BN, which helps to solve the long-term critical problem that the graphene is difficult to nucleate and grow on an insulating substrate, and to avoid the series of problems introduced by the complicated processes of the transferring of the graphene and the subsequent clipping manufacturing for a nanoribbon and the like. Moreover, the growth of the graphene nanoribbon on the h-BN also has the following remarkable superior effects that, on the one hand, it enables to improve the graphene quality for achieving a high mobility ratio of a charge carrier, on the other hand, by controlling the graphene morphology such as width, marginal structure to realize the regulation of the electron structure of the graphene, it enables to improve the property of the graphene, as well as simplify preparation process of the graphene, reduce production cost, so that the graphene is more widely applicable for the preparation of electron devices.

ILLUSTRATIONS OF REFERENCE SIGNS 10 h-BN
11 h-BN groove
12 graphene nanoribbon

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to FIG. 1 to FIG. 9. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

Figure 1:
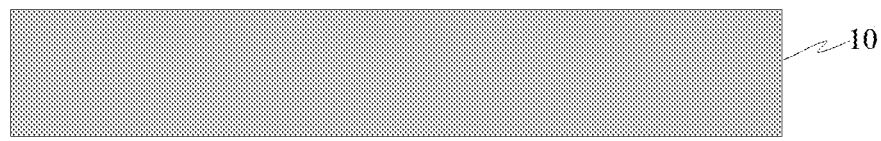
FIG. 1 shows the structural diagram presented by first step of the preparation method of a graphene nanoribbon on h-BN.
Figure 2:
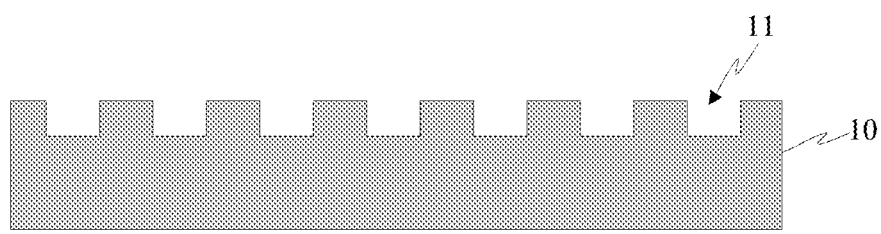
FIG. 2 shows the structural diagram presented by second step of the preparation method of a graphene nanoribbon on h-BN.
Figure 3:
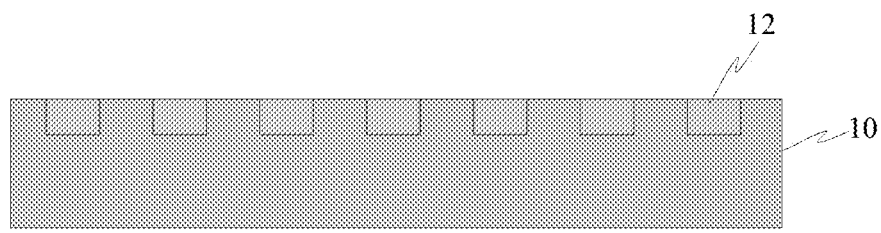
FIG. 3 shows the structural diagram presented by third step of the preparation method of a graphene nanoribbon on h-BN.

As shown in FIG. 1 to FIG. 3, the present embodiment provides a preparation method of a graphene nanoribbon on h-BN, by which an h-BN groove template with a nano ribbon-shaped groove structure is obtained on h-BN by adopting a metal catalytic etching method, and subsequently a nucleation of a graphene in the nano ribbon-shaped groove structure is achieved to grow the graphene nanoribbon by controlling a CVD growth conditions. The h-BN is known as a "white" graphene, which is insulator, and has a same layered hexagon planar structure with the graphene. The h-BN features an atomically flat surface but without a dangling bond on (0001) plane. The lattice mismatch between the h-BN and the graphene is just 1.8%, and the doping effect thereof is poor, thereby enabling to maintain the intrinsic physical property of the graphene to the greatest extent, and making the h-BN become the most potential insulating substrate of a graphene device. While during the direct growth of a graphene nanoribbon on h-BN, by controlling the metal catalytic etching conditions and CVD reaction conditions, it enables to obtain the graphene nanoribbon with a controllable growth of morphology and structure, so as to achieve the object of improving its electrical properties.

The preparation method of a graphene nanoribbon on h-BN comprises the following steps:

As shown in FIG. 1 and FIG. 2, firstly performing step 1): forming a h-BN groove 11 plate with a nano ribbon-shaped groove structure on the h-BN 10 adopting a metal catalysis etching method;

As an example, in step 1), the h-BN comprises one of an h-BN single crystal bulk, an h-BN thin film cleaved by a mechanical cleavage, and an h-BN thin film obtained by a chemical vapor deposition method. In the present embodiment, the h-BN is an h-BN thin film with a cleavage plane of atomic-level flatness by the mechanical cleavage method.

As an example, the metal catalysis etching method in step 1) comprises steps of:

1-1) forming a metal particle thin film with a catalysis etching effect on the h-BN 10;

Specifically, in the embodiment, a $Zn(NO_3)_2$ solution, which has a catalysis etching effect on the h-BN, is formed on the h-BN surface by a spin coating process. Moreover, density and distribution of the etched nano ribbon-shaped groove structure is controlled by controlling a concentration of metal catalysis particle solution, where the concentration of metal catalysis particle is $5.29*10-3$ mol/L~$5.29*10-1$ mol/L.

1-2) performing anneal etching on the h-BN with the metal particle thin film, to obtain the h-BN groove 11 template with the nano ribbon-shaped groove structure.

Further, the anneal etching in step 1-2) is to perform a anneal etching on the h-BN in a CVD tube furnace, with a carrier gas of Ar, and a working gas of $H_2$ or $O_2$ according to different etching orientation; wherein, it is available to obtain a nano ribbon-shaped groove structure with an Armchair boundary structure when the H2 and Ar features a flow rate of 1:1~1:10, and it is available to obtain a nano ribbon-shaped groove structure with a Zigzag edge structure when the O2 and Ar features a flow rate of 1:1~0:10.

As an example, a temperature range of the anneal etching is 900° C.~1300° C., and a etching rate of the h-BN is controlled by controlling the temperature of the anneal etching.

As an example, a time range of the anneal etching is 10 min~300 min, and a depth, width and length of the nano ribbon-shaped groove structure is controlled by a time control of the anneal etching.

As an example, the nano ribbon-shaped groove structure features a depth of a thickness of 1~9 atomic layers, a width less than or equal to 1 μm, and a length larger than or equal to 100 nm.

As shown in FIG. 3, subsequently perform step 2): growing a graphene nanoribbon 12 in the h-BN groove template by adopting a chemical vapor deposition method.

As an example, the chemical vapor deposition method in step 2) comprises one of a low pressure chemical vapor deposition method LPCVD, a plasma enhanced chemical vapor deposition PECVD, an ordinary pressure chemical vapor deposition CVD and a pulsed laser deposition PLD.

As an example, a carbon source for growing the graphene nanoribbon in step 2) comprises a solid-state carbon source, a gaseous carbon source and a liquid-state carbon source, wherein, the solid-state carbon source comprises one of a graphite, a glucose and a polymethacrylate or a combination thereof, the liquid-state carbon source comprises a liquid benzene, the gaseous carbon source comprises one of a methane, an ethene and an acetylene or a combination thereof. In the embodiment, the carbon source for growing the graphene nanoribbon is the acetylene and methane, wherein a gas flow ratio of the acetylene and the methane is 1:1~1:30.

Besides, when growing the graphene nanoribbon, a step of adjusting a partial pressure ratio of the carbon source gas by introducing a silane is included to control a suitable growth rate, wherein, a gas volume range of the methane, silane and acetylene is 1:1:10~1:1:20.

As an example, an air pressure range for growing the graphene nanoribbon is 1 Pa~10 Pa, a temperature range therefor is 800° C.~1300° C., and a growth time range therefor is 1 min~1 Hour.

As an example, the obtained graphene nanoribbon in step 2) features a width less than or equal to 1 μm, a depth of a thickness of 1~9 atomic layers, and a length larger than or equal to 100 nm.

Figure 4:
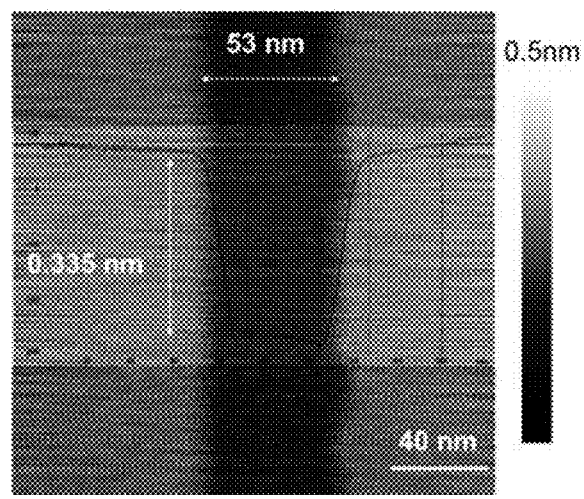
FIG. 4 shows an atomic force microscope image of h-BN grooves with an etched depth of a single or a plurality of atomic layers.
Figure 5:
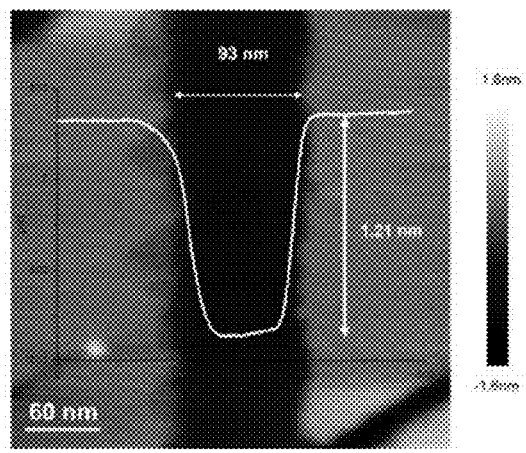
FIG. 5 shows an atomic force microscope image of h-BN grooves with an etched depth of a single or a plurality of atomic layers.

FIG. 1 to FIG. 3 are shown to a specific implementation process, comprising the following steps of:

Step 1), mechanically stripping a h-BN single crystal on a SiO2/Si substrate, to obtain a h-BN cleavage plane with an exposed fresh atomic layer;

Step 2), spin coating a Zn(NO3)2 solution on the obtained h-BN cleavage plane by a spin coater, which is subsequently placed into a CVD tube furnace, and a gas mixture of argon and hydrogen or a gas mixture of argon and oxygen is fed with a flow rate of 300 sccm, wherein the argon-hydrogen mixture or the argon-oxygen mixture is in a volume ratio of 1:5. Heating to 1200° C. in a rate of 20° C./min, and remaining at the temperature for 60 min until a step or a groove template with a nanoribbon structure is formed due to the etching of the h-BN by the reaction gas under the catalytic action of the metal particles; as shown in FIG. 2, which is shown to an obtained h-BN etched groove with a depth of a single atomic layer. FIG. 4 and FIG. 5 respectively show atomic force microscope images under an AFM-Contact mode of h-BN grooves with an etched depth of a single or a plurality of atomic layers.

Step 3), after the natural cooling of CVD, the h-BN/SiO2/Si structure is taken out, and is washed by hydrochloric acid, deionized water, isopropyl alcohol in sequence to remove the residual Zn(NO3)2 on the surface of the sample, and is subsequently blow-dried by N2.

Figure 6:
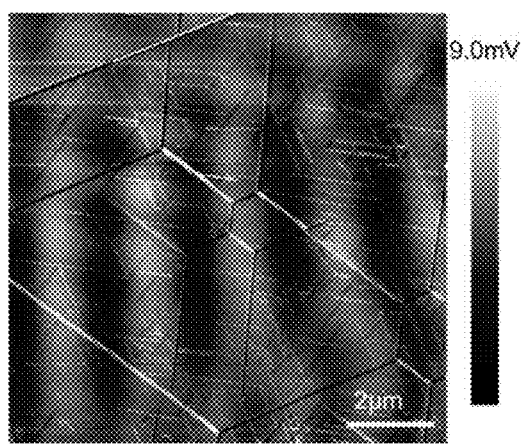
FIG. 6 shows an atomic force microscope image of an h-BN groove with an etched boundary of Zigzag and an atomic force microscope image of graphene nanoribbon grown in the groove.
Figure 7:
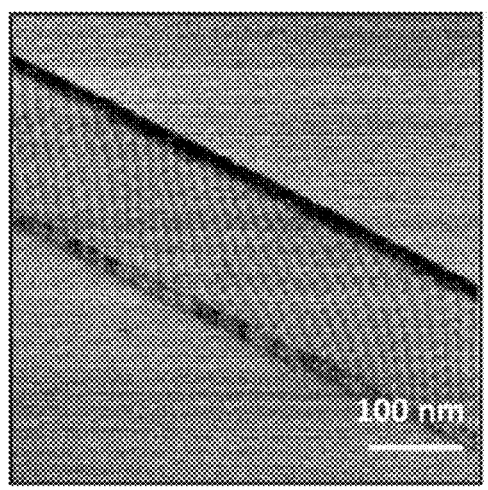
FIG. 7 respectively shows an atomic force microscope image of an h-BN groove with an etched boundary of Zigzag and an atomic force microscope image of graphene nanoribbon grown in the groove.
Figure 8:
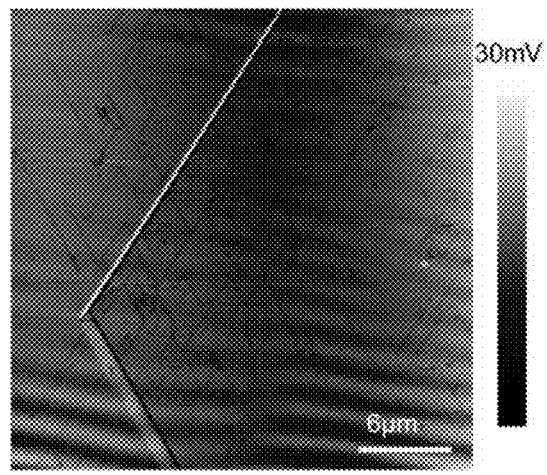
FIG. 8 shows an atomic force microscope image of an h-BN groove with an etched boundary of Armchair and an atomic force microscope image of graphene nanoribbon grown in the groove.
Figure 9:
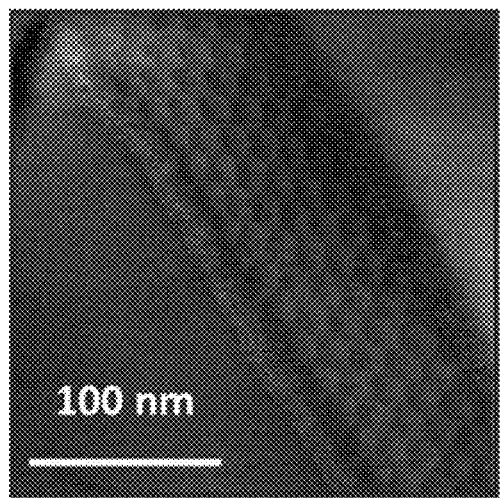
FIG. 9 shows an atomic force microscope image of an h-BN groove with an etched boundary of Armchair and an atomic force microscope image of graphene nanoribbon grown in the groove.

Step 4), the dried h-BN/SiO2/Si structure is placed in the CVD tube furnace, which is heated to 1300° C. in Ar atmosphere with a rate of 20° C./min, and CH4 and C2H2 are fed with a flow ratio of 1:20; after growing for 5 min, the carbon source is cut off, and the temperature is natural cooled in Ar atmosphere. FIG. 6 and FIG. 7 respectively show an atomic force microscope image in AFM-Contact mode of an h-BN groove with an etching boundary of Zigzag and an atomic force microscope image of graphene nanoribbon grown in the groove. FIG. 8 and FIG. 9 respectively show an atomic force microscope image in AFM-Contact mode of an h-BN groove with an etching boundary of Armchair and an atomic force microscope image of graphene nanoribbon grown in the groove. In the atomic force microscope image in AFM-Contact mode, it can be analyzed that the width of the graphene nanoribbon is 30 nm.

From the above, in the preparation method of a graphene nanoribbon on h-BN of the present invention, the nano ribbon-shaped groove structure is obtained as a template by metal catalysis etching the h-BN surface, the nucleation and growth of the graphene along the edge of the h-BN nanoribbon groove is achieved until filling the complete nanoribbon groove by controlling the CVD depositional conditions, to form the graphene nanoribbon. Nucleation energy for the nucleation of the graphene in the h-BN nanoribbon groove is less than the nucleation energy needed on the h-BN surface, whereas it is apt to nucleate at the defects of the substrate, especially at the boundary of the h-BN nanoribbon groove. By controlling an appropriate CVD process conditions, such as air pressure, temperature, time and gas flow ratio, as well as taking advantage of the difference of the nucleation energy between the h-BN surface and the boundary of the h-BN nanoribbon groove, the nucleation of the graphene firstly appears at the boundary of the h-BN nanoribbon groove, then fills the h-BN groove in a growth mode of step flow to form the graphene nanoribbon. It is significant benefit to the subsequent morphological control of the graphene by adopting a metal catalysis etching process for etching h-BN to control the morphology of the h-BN nano ribbon groove template. Due to the epitaxial growth of the graphene, the formed marginal structure of the graphene is correspondence with the boundary structure of the h-BN, and, a number of layers, width, length and a density distribution of the graphene nanoribbon are influenced by the depth, width, length and density of the h-BN etching groove.

In the present invention, a CVD method is adopted to directly prepare a morphology controllable graphene nanoribbon on the h-BN, which helps to solve the long-term critical problem that the graphene is difficult to nucleate and grow on an insulating substrate, and to avoid the series of problems introduced by the complicated processes of the transferring of the graphene and the subsequent clipping manufacturing for a nanoribbon and the like. Moreover, the growth of the graphene nanoribbon on the h-BN also has the following remarkable superior effects that, on the one hand, it enables to improve the graphene quality for achieving a high mobility ratio of a charge carrier, on the other hand, by controlling the graphene morphology such as width, marginal structure to realize the regulation of the electron structure of the graphene, it enables to improve the property of the graphene, as well as simplify preparation process of the graphene, reduce production cost, so that the graphene is more widely applicable for the preparation of electron devices.

Therefore, the present invention effectively overcomes a variety of disadvantages in the prior art and has high industrial utility value.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A preparation method of a graphene nanoribbon on h-BN, comprising steps of:
   1) forming a h-BN groove template with a nano ribbon-shaped groove structure on the h-BN by adopting a metal catalysis etching method;
   2) growing a graphene nanoribbon in the h-BN groove template by adopting a chemical vapor deposition method;
   wherein the metal catalysis etching method in step 1) comprises steps of:
      1-1) forming a metal particle thin film with a catalysis etching effect on the h-BN;
      1-2) performing anneal etching on the h-BN with the metal particle thin film, to obtain the h-BN groove template with the nano ribbon-shaped groove structure.

2. The preparation method of a graphene nanoribbon on h-BN according to claim 1, characterized in that: in step 1), the h-BN comprises one of an h-BN single crystal bulk, an h-BN thin film cleaved by a mechanical cleavage, and an h-BN thin film obtained by a chemical vapor deposition method.

3. The preparation method of a graphene nanoribbon on h-BN according to claim 2, characterized in that: the h-BN is an h-BN thin film with a cleavage plane of atomic-level flatness obtained by the mechanical cleavage method.

4. The preparation method of a graphene nanoribbon on h-BN according to claim 1, characterized in that: in step 1-1), a metal salt solution, which has a catalysis etching effect on the h-BN, comprising one of Zn(NO3)2, Cu(NO3)2, NiCl2, FeCl2, FeCl3, CuSO4, MgCl2 or a combination thereof, is formed on the h-BN surface by a spin coating process.

5. The preparation method of a graphene nanoribbon on h-BN according to claim 4, characterized in that: density and distribution of the etched nano ribbon-shaped groove structure are controlled by controlling a concentration of metal catalysis particle solution, where the concentration of metal catalysis particle is 5.29*10-3 mol/L~5.29*10-1 mol/L, density of the etched nanoribbon is controlled by changing the concentration of metal catalysis particle solution.

6. The preparation method of a graphene nanoribbon on h-BN according to claim 1, characterized in that: the anneal etching in step 1-2) is to perform a anneal etching on the h-BN in a CVD tube furnace, with a carrier gas of Ar, and a working gas of H2 or O2 according to different etching orientation; wherein, it is available to obtain a nano ribbon-shaped groove structure with an Armchair boundary structure when the H2 and Ar features a flow rate of 1:1~1:10, and it is available to obtain a nano ribbon-shaped groove structure with a Zigzag edge structure when the O2 and Ar features a flow rate of 1:1~0:10.

7. The preparation method of a graphene nanoribbon on h-BN according to claim 1, characterized in that: a temperature range of the anneal etching is 900 C.°~1300 C.°, and an etching rate of the h-BN is controlled by controlling the temperature of the anneal etching.

8. The preparation method of a graphene nanoribbon on h-BN according to claim 1, characterized in that: a time range of the anneal etching is 10 min~300 min, and a depth, width and length of the nano ribbon-shaped groove structure is controlled by a time control of the anneal etching.

9. The preparation method of a graphene nanoribbon on h-BN according to claim 1, characterized in that: the nano ribbon-shaped groove structure features a depth of a thickness of 1~9 atomic layers, a width less than or equal to 100 nm, and a length larger than or equal to 100 nm.

10. The preparation method of a graphene nanoribbon on h-BN according to claim 1, characterized in that: the chemical vapor deposition method in step 2) comprises one of a low pressure chemical vapor deposition method LPCVD, a plasma enhanced chemical vapor deposition PECVD, an ordinary pressure chemical vapor deposition CVD and a pulsed laser deposition PLD.

11. The preparation method of a graphene nanoribbon on h-BN according to claim 1, characterized in that: a carbon source for growing the graphene nanoribbon in step 2) comprises a solid-state carbon source, a gaseous carbon source and a liquid-state carbon source, wherein, the solid-state carbon source comprises one of a graphite, a glucose and a polymethacrylate or a combination thereof, the liquid-state carbon source comprises a liquid benzene, the gaseous carbon source comprises one of a methane, an ethene and an acetylene or a combination thereof.

12. The preparation method of a graphene nanoribbon on h-BN according to claim 1, characterized in that: the carbon source for growing the graphene nanoribbon in step 2) is the acetylene and methane, wherein a gas flow ratio of the acetylene and the methane is 1:1~1:30.

13. The preparation method of a graphene nanoribbon on h-BN according to claim 12, characterized in that: when growing the graphene nanoribbon, a step of adjusting a partial pressure ratio of the carbon source gas by introducing a silane is included to control a suitable growth rate, wherein, a gas volume range of the methane, silane and acetylene is 1:1:10~1:1:20.

14. The preparation method of a graphene nanoribbon on h-BN according to claim 1, characterized in that: an air pressure range for growing the graphene nanoribbon is 1 Pa~10 Pa, a temperature range therefore is 800 C.°~1300 C.°, and a growth time range therefore is 1 min~1 Hour.

15. The preparation method of a graphene nanoribbon on h-BN according to claim 1, characterized in that: the obtained graphene nanoribbon in step 2) features a width less than or equal to 1 μm, a depth of a thickness of 1~9 atomic layers, and a length larger than or equal to 100 nm.

* * * * *